United States Patent [19]

Shintani et al.

[11] Patent Number: 5,755,879
[45] Date of Patent: May 26, 1998

[54] METHODS FOR MANUFACTURING SUBSTRATES TO FORM MONOCRYSTALLINE DIAMOND FILMS BY CHEMICAL VAPOR DEPOSITION

[75] Inventors: Yoshihiro Shintani, Tokushima; Takeshi Tachibana, Kobe; Kozo Nishimura, Kobe; Koichi Miyata, Kobe; Yoshihiro Yokota, Kobe; Koji Kobashi, Kobe, all of Japan

[73] Assignee: Kabushiki Kaisha Kobe Seiko Sho, Kobe, Japan

[21] Appl. No.: 560,078

[22] Filed: Nov. 17, 1995

[30] Foreign Application Priority Data

Nov. 25, 1994 [JP] Japan .................... 6-315974

[51] Int. Cl.⁶ .................................... C30B 29/20
[52] U.S. Cl. ................. 117/101; 117/90; 117/94; 117/104; 117/929
[58] Field of Search .................. 117/101, 104, 117/94, 90, 929; 148/678

[56] References Cited

U.S. PATENT DOCUMENTS

| | | | |
|---|---|---|---|
| 4,822,466 | 4/1989 | Rubalais et al. | 204/192.15 |
| 5,282,946 | 2/1994 | Kinoshita et al. | 148/678 |
| 5,298,286 | 3/1994 | Yang et al. | |
| 5,403,399 | 4/1995 | Kurihara et al. | 219/121.47 |
| 5,576,107 | 11/1996 | Hirabayashi et al. | 428/408 |

FOREIGN PATENT DOCUMENTS

| | | |
|---|---|---|
| 0 534729 | 3/1993 | European Pat. Off. |
| 0 598361 | 5/1994 | European Pat. Off. |

*Primary Examiner*—Robert Kunemund
*Attorney, Agent, or Firm*—Oblon, Spivak, McClelland, Maier & Neustadt, P.C.

[57] ABSTRACT

A method is presented to manufacture substrates for growing monocrystalline diamond films by chemical vapor deposition (CVD) on large area at low cost. The substrate materials are either Pt or its alloys, which have been subject to a single or multiple cycle of cleaning, roller press, and high temperature annealing processes to make the thickness of the substrate materials to 0.5 mm or less, or most preferably to 0.2 mm or less, so that either (111) crystal surfaces or inclined crystal surfaces with angular deviations within ±10 degrees from (111), or both, appear on the entire surfaces or at least part of the surfaces of the substrates. The annealing is carried out at a temperature above 800° C. The present invention will make it possible to markedly improve various characteristics of diamond films, and hence put them into practical use.

6 Claims, 7 Drawing Sheets

15.0 μm 15.0 μm 10.0μm 20.0μm

METHODS FOR MANUFACTURING SUBSTRATES TO FORM MONOCRYSTALLINE DIAMOND FILMS BY CHEMICAL VAPOR DEPOSITION

BACKGROUND OF THE INVENTION

1. Field of the Invention

The present invention is related to a novel method of manufacturing substrates on which monocrystalline diamond films can be grown by chemical vapor deposition (CVD). The diamond films made according to the present invention can be used for electronic devices and sensors, such as transistors and diodes, heat sinks, surface acoustic wave devices, X-ray windows, optical materials, antiwear materials, and decorating materials, all including coatings.

2. Description of the Related Art

Diamond is known to be excellently resistant to high temperature. It has a large band gap (5.5 eV), and hence is electrically a good insulator in its undoped state. However, it can be semiconducting by doping suitable impurity atoms in it. Furthermore, diamond has excellent electrical properties such that the breakdown voltage is high, the saturation velocities of carriers (electrons and holes) are also high, and the dielectric constant, and hence the dielectric loss, is small. These characteristics are most suitable for diamond applications to electronic sensors and devices operational at high temperature, high frequency, and high electric field.

Diamond is also expected to be used for various applications, e.g., optical sensors and light emission devices in the short wavelength region based on diamond's large band gap; heat sinks based on its high thermal conductivity and small specific heat, surface acoustic wave devices based on its extreme hardness (diamond is the hardest among all materials); and X-ray windows and optical materials based on its high transmission and low refractive index over a wide range of wavelength from infrared to near ultraviolet. Moreover, diamond is used as antiwear parts of many kinds of cutting tools.

In order to fully utilize the excellent characteristics of diamond for those applications, it is most important to synthesize high quality monocrystalline diamond films in which structural defects are minimized. Furthermore, low cost production of monocrystalline diamond films on large area is necessary for its practical use. As is very well known, bulk diamond crystals are presently produced either by mining natural diamond or by artificially synthesizing bulk crystals under high pressure-high temperature conditions. However, the areas of crystal facets for those diamonds are only about 1 cm$^2$ at best, and such diamond is extremely expensive. Therefore, industrial applications of diamond today are limited only to specific fields, such as abrasive powders and high precision cutting tool tips, where only small size diamond is sufficient.

Regarding CVD of diamond films, the following techniques are known: microwave plasma CVD (for example, see Japanese patents (kokoku) Nos. Hei 59-27754 and Hei 61-3320), radio-frequency plasma CVD, hot filament CVD, direct-current plasma CVD, plasma-jet CVD, combustion CVD, and thermal CVD. By those techniques, it is possible to form continuous diamond films over a large area. However, the diamond films grown by those methods on non-diamond substrates such as silicon are polycrystalline as seen in FIG. 1, where diamond grains are coalesced in a random fashion and therefore numerous grain boundaries exist in the film. Techniques to synthesize highly oriented diamond films as shown in FIG. 2 are known, but they also are polycrystalline, including a high density of grain boundaries in the film.

Because of such grain boundaries, neither polycrystalline nor highly oriented diamond films are able to achieve electrical characteristics that are originally owned by bulk diamond crystals, which are free of grain boundaries, as carriers for electrical conduction are trapped or scattered at the grain boundaries in the polycrystalline films. Therefore, the performance of electronic sensors and devices made of either polycrystalline or highly oriented diamond films is far inferior to that made of bulk single crystal diamond.

In optical applications, polycrystalline diamond has a lower optical transmittance than bulk diamond crystals because of light absorption and scattering at the grain boundaries. Likewise, in antiwear applications using polycrystalline diamond films, chipping occurs more easily at the grain boundaries than in bulk diamond.

It is known that monocrystalline diamond films can be grown by CVD on bulk diamond and cubic boron nitride single crystals. Unfortunately, large crystal facets are not available for both materials, and thus it is not possible to deposit large-area monocrystalline diamond films on those substrates.

It is also known that diamond grains grown on nickel (Ni) or copper (Cu) substrates by CVD are oriented to a certain degree. However, in the former case, there are problems in that the Ni substrate becomes fragile and deteriorated under CVD conditions for diamond growth, where Ni is in contact with a high temperature hydrogen plasma. Furthermore, Ni reacts with deposited diamond to convert it to graphite [D. N. Belton and S. J. Schmeig, J. Appl. Phys., Vol. 66, p. 4223 (1989)]. On the other hand, for the latter case, the deposited diamond film is peeled off the Cu substrate after the specimen is pulled out of the CVD reactor due to the stress between the diamond film and the Cu substrate generated by the difference between the temperature during CVD (higher than 600° C.) and room temperature, and the difference in the thermal expansion coefficients between diamond and Cu. The linear thermal expansion coefficient of Cu is about ten times greater than that of diamond [J. F. Denatale et al., J. Mater. Sci., Vol. 27, p. 553 (1992)].

Diamond CVD on platinum (Pt) and other transition metals has been attempted already, but it was only polycrystalline diamond films or diamond particles that have resulted, and monocrystalline diamond films have not been obtained [Sakamoto and Takamatsu, Hyomen Gijutsu, Vol. 44, No. 10, p. 47 (1993); M. Kawarada et al., Diamond and Related Materials, Vol. 2, p. 1083 (1993); D. N. Belton and S. J. Schmeig, J. Appl. Phys., Vol. 69, No. 5, p. 3032 (1991); D. N. Belton and S. J. Schmeig, Surface Sci., Vol. 233, p. 131 (1990); Y. G. Ralchenko et al., Diamond and Related Materials, Vol. 2, p. 904 (1993)].

For practical use of diamond films in industry, particularly for electronics and optics, it is necessary to achieve growth of monocrystalline diamond films that are either completely free of grain boundaries or include sufficiently low density of grain boundaries on large area at low cost. Unfortunately, such technology has not been found yet.

SUMMARY OF THE INVENTION

The present invention provides with a novel method for manufacturing substrates for growing monocrystalline diamond films by CVD on large area at low cost. The substrate materials are either Pt or its alloys that have been subject to a single or multiple cycle of cleaning, roller press, and high temperature annealing processes to make the thickness of the substrate materials to 0.5 mm or less, or preferably to 0.2 mm or less, so that either (111) crystal surfaces or inclined crystal surfaces with angular deviations within ±10 degrees from (111), or both, appear on the entire surfaces or at least on part of the surfaces of the substrates. The annealing is carried out at a temperature above 800° C. The present invention will make it possible to markedly improve various characteristics of diamond films, and hence put them into practical use.

BRIEF DESCRIPTION OF THE DRAWINGS

FIG. 5(a) schematically illustrates a single crystal Pt substrate, while

DESCRIPTION OF THE INVENTION AND PREFERRED EMBODIMENTS

The present invention is based on a discovery by the present inventors that monocrystalline diamond films with (111) surface can be grown by CVD on (111) surfaces of Pt or Pt alloys. Here, it should be noted that in what follows, the expression, "(111) crystal surfaces of Pt or its alloys," is often used to represent not only (111) crystal surfaces of Pt and Pt alloys but also all Pt and its alloy crystal surfaces with angular deviations within±10 degrees from (111). Descriptions will be often given only for Pt for the sake of simplicity, but the extension to Pt alloys is obvious.

Figure 1:
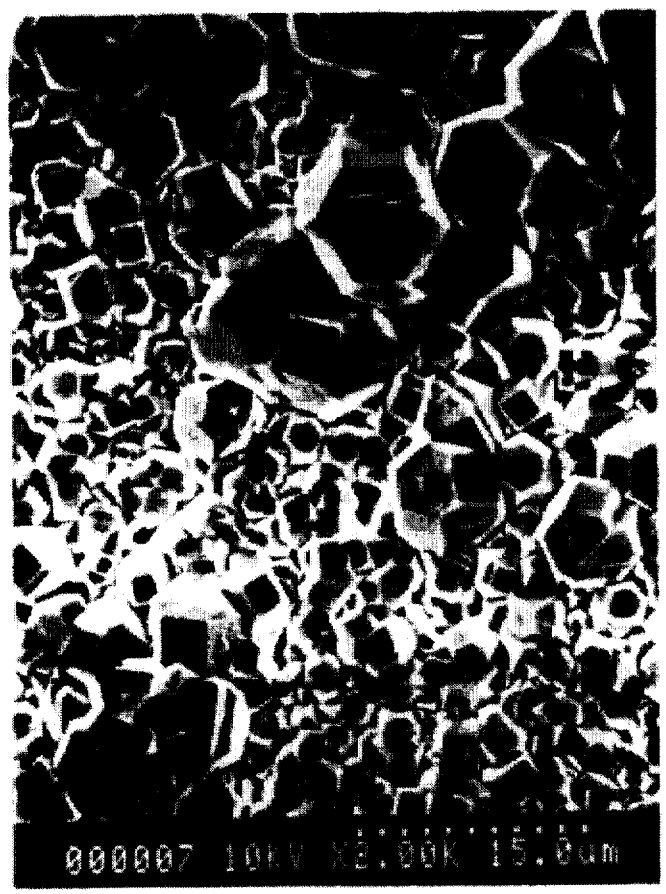
FIG. 1 is a photograph by scanning electron microscopy (SEM) of a polycrystalline diamond film, where diamond grains are randomly oriented.
Figure 2:
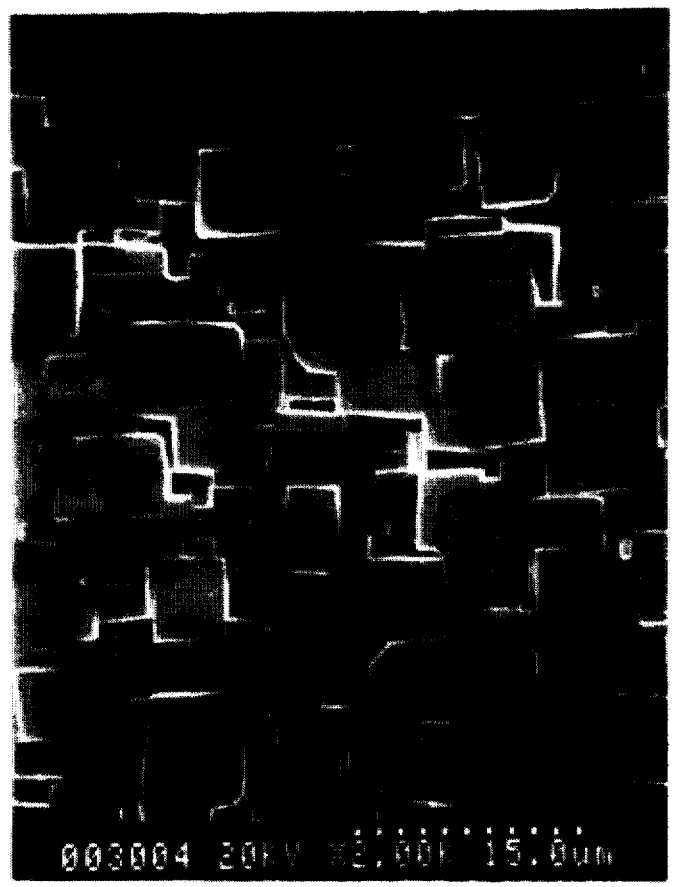
FIG. 2 is a SEM photograph of a highly oriented diamond film where square (100) facets of diamond grains are regularly oriented in the same direction. However, microscopic analyses have revealed that there are misorientations of one to five degree angles between adjacent diamond grains.
Figure 3:
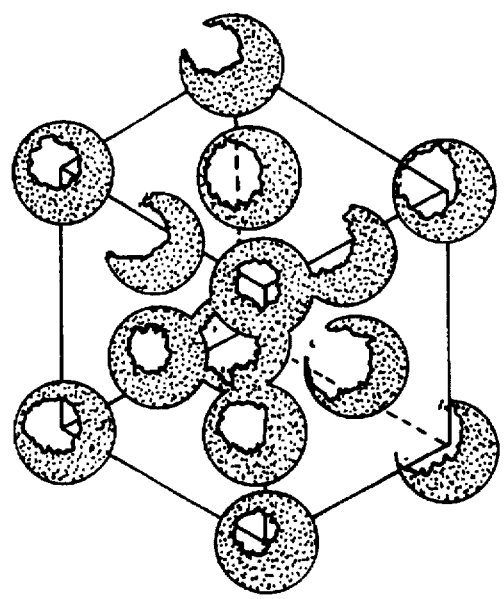
FIG. 3 schematically shows the crystal structure of Pt, known as the face-centered-cubic (fcc) structure.
Figure 4:
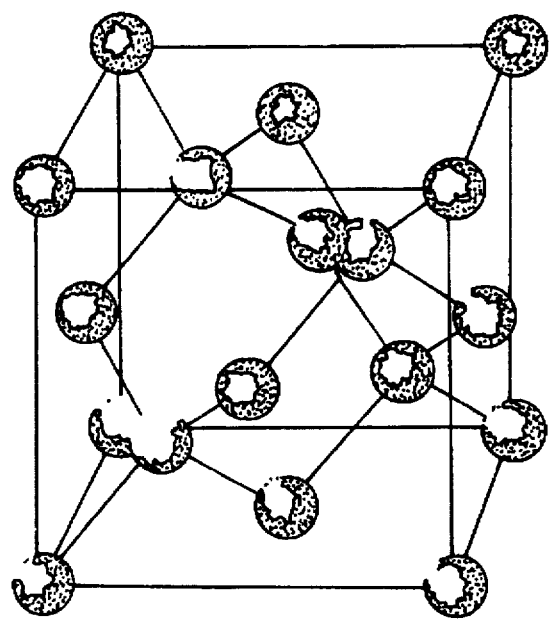
FIG. 4 schematically shows the crystal structure of diamond, known as the diamond structure.

In the present invention, there are a number of issues that are difficult to understand by the existing theories of heteroepitaxial growth, i.e., growth of monocrystalline diamond films on non-diamond substrates. The first is the fact that the lattice constant of Pt (3.9231 Å) differs as much as about 10% from that of diamond (3.566 Å). It has been generally considered that growth of single crystal film is not possible in such a case that there is a large difference in lattice constants between the substrate material and the material to be deposited. The second is the fact that the crystal structure of Pt is fcc (see FIG. 3), which is different from the diamond structure (see FIG. 4). Therefore, the Pt substrate and the deposited diamond film cannot be structurally continuous. Thus, growth of monocrystalline diamond films on such a substrate as Pt has been no better than a speculation. In fact, only randomly oriented, polycrystalline diamond films have been obtained by CVD on Pt foils.

By contrast, it was discovered by the present inventors that monocrystalline diamond films can be grown by CVD not only on Pt but also on Pt alloys, if (111) crystal surfaces are exposed at the surfaces of the Pt or Pt alloy substrates.

It was also discovered in the present invention that in order to nucleate diamond on Pt or Pt alloy substrates at high density, it is only necessary to scratch the substrate surfaces with diamond powder or diamond paste by buff or ultrasonic polishing prior to CVD of diamond. It has been generally understood that the substrate surface must be atomically smooth for heteroepitaxial growth. This traditional concept is in strong contrast to the present experimental discovery, because the Pt or Pt alloy surfaces are considerably roughened by the polishing after the (111) crystal surfaces have been obtained on the substrate surface, and yet monocrystalline diamond films can be grown on such substrates. Namely, the present invention teaches that monocrystalline diamond films can be grown by CVD even on such roughened substrates. Such a fact is impossible to be predicted by the existing theories of heteroepitaxy.

The present inventors further discovered that domains of (111) crystal surfaces appear on Pt or Pt alloy foils if thick foils are thinned down to 0.5 mm or less, preferably 0.2 mm or less, by a single or repeated cycle of the processing comprising roller press followed by high temperature annealing. Similar domains can also be formed for Pt or Pt alloy films deposited on suitable substrates. The average area of the domains is dependent of the processing conditions, but typically areas larger than 2500 square microns (1 micron=$10^{-6}$ m) are easily achieved. Monocrystalline diamond films are grown on each of the single crystal domains of Pt or Pt alloy substrates by CVD. The present invention has been completed according to the findings obtained by the experiments described above.

The mechanism of diamond formation on (111) crystal surfaces of Pt or its alloys is not known but inferred as follows: since Pt is known to have catalytic actions, molecules adsorbed to its surface are easily decomposed. Therefore, the density of chemically active carbon species is assumed to be high at the substrate surface during CVD. Such carbon species may diffuse into the interior of the substrate. As a result, the Pt surface, and the surface layer as well, is supersaturated with carbon atoms, which then crystallize to be diamond nuclei. Along with the formation of diamond nuclei, nondiamond structures of carbon such as graphite can also be produced, but it is known that they are readily etched by reactions with chemically active hydrogen and oxygen in the plasma of the source gas during CVD. If it is carbon atoms dissolved in the substrate that form diamond nuclei, the orientation of the individual diamond nucleus is determined solely by the (111) structure inside the substrate. Therefore, the surface roughness due to the mechanical polishing gives little effect on the orientation of diamond nuclei. Rather, the surface roughness has an effect of accelerating diffusion of carbon atoms inside the substrate.

The use of Pt or its alloys for the substrate material has the following grounds: the catalytic action of Ni is so strong that diamond once formed is converted to graphite. On the other hand, the catalytic action of Cu is too weak, and the carbon density inside the Cu substrate cannot be sufficiently high for diamond nucleation, as Cu does not have a strong affinity with carbon. Silicon (Si), which is most often used as substrates for CVD of diamond, forms a strong covalent bond with carbon, so that spontaneous diamond nucleation is suppressed. By contrast, although Pt has catalytic actions, they are not excessively strong unlike Ni, and further, Pt allows carbon atoms to dissolve and nucleate in it. Moreover, the chemical affinity of Pt with carbon is moderate. Accordingly, Pt or its alloys seem to possess the most suitable conditions as the substrate for diamond film heteroepitaxy by CVD.

It is apparent that the effects described above mostly on Pt are also applicable to Pt alloys. In this case, the minority components of the Pt alloys can include the VIA elements such as Cr, Mo, and W, the VIIA elements such as Fe, Co, Ir, Ni, and Pd, and the IB elements such as Au, Ag, and Cu. It is known that the VIA and VIIA elements form stable carbides, the VIIIA elements react strongly with carbon, and the IB elements are inactive with carbon. Therefore, by using Pt alloys that contain those elements, it is possible to control the catalytic action of Pt alloys, and add new chemical reactivity to them. Moreover, a fine tuning of the lattice constant is possible by alloying, and hence the orientation of the deposited diamond film can also be controlled. These are the major advantages of using Pt alloys as the substrates for the deposition of monocrystalline diamond films.

According to a study by the inventors, those elements in the Pt alloys should not exceed 50%, otherwise the catalytic and other effects of Pt are too weakened.

Regarding the crystal surfaces of Pt and its alloys, it is preferable to be exactly (111). However, the present inventors found that monocrystalline diamond films can be grown on off-axis crystal surfaces, if the angular deviation is within ±10° from (111), because the difference of the inclined (111) surface from the exact (111) surface is only the existence of atomic-scale step structures in the former case. In case that the deviation is beyond ±10°, monocrystalline diamond films are not grown, because the desired crystal surfaces do not appear.

The present inventors found that in order to obtain (111) crystal surfaces on Pt or Pt alloy foils by the roller press/high temperature annealing process, it is necessary to thin them down to 0.5 mm or less, or preferably 0.2 mm or less. In case that the foil thickness is greater than 0.5 mm, it is not only that (111) crystal surfaces do not appear at the foil surface at sufficiently high frequency, but also that the interfacial stress between the substrate and the deposited diamond builds up, which results in a peel-off of the diamond film.

For the formation of monocrystalline diamond film, it is preferable that the entire substrate of Pt or its alloys is a single crystal. However, even though the substrate has a domain structure consisting of (111) crystal surfaces with different azimuthal orientations, a monocrystalline diamond film can be grown on each of the domains, resulting in a domain structure of the deposited monocrystalline diamond film. The properties of such a film are substantially the same as those of uniform monocrystalline diamond films or bulk diamond, if the domain areas are sufficiently large.

Figure 5A:
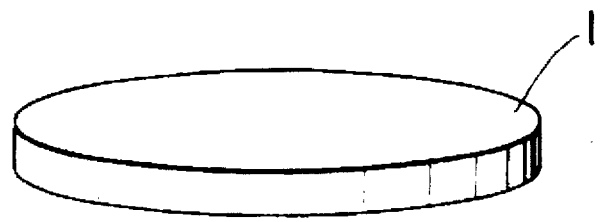
Figure 5B:
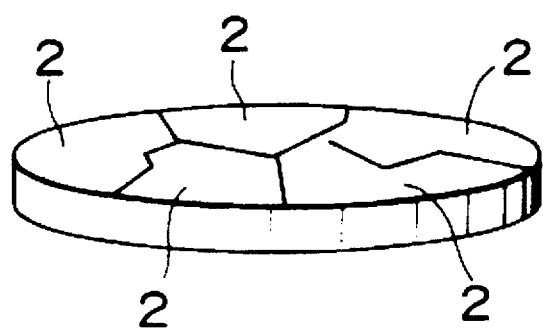
FIG. 5(b) is a Pt substrate consisting of domains of Pt single crystals.

FIGS. 5(a) and 5(b) illustrate examples of such substrate structures. FIG. 5(a) is the case of the single crystal substrate 1 of Pt or its alloys. The surface of the substrate is (111). FIG. 5(b) is the case of domain structure composed of plural single crystals 2 with (111) surfaces. The azimuthal orientations of the domains 2 are different from each other.

In order to obtain substrates with (111) crystal surfaces, the process including roller press and annealing above 800° has to be repeated. Annealing is usually done in vacuum, but in the present invention, it is preferable to be undertaken in an oxidation atmosphere such as in air. According to the studies by the present inventors, annealing in an oxidation atmosphere facilitates the growth of monocrystalline diamond films in CVD, presumably because of some effects of oxygen adsorbed at the substrate surface during the annealing. Annealing in a reduction environment such as in hydrogen gas is not recommended, because Pt and its alloys are deteriorated in such an environment.

As explained before, continuous monocrystalline diamond films are grown on Pt or Pt alloy substrates, even though the substrate surfaces have been roughened by scratching using buff or ultrasonic polishing with diamond powder or diamond paste prior to diamond CVD. This is because the orientations of diamond nuclei are determined by the (111) crystal structure inside the Pt or Pt alloy substrate, as carbon atoms are dissolved into the substrate bulk. Therefore, the roughening of the substrate surfaces gives little effect on the orientation of diamond nuclei. The roughened surfaces rather facilitate carbon atoms to diffuse into the substrate interior. This is really an unexpected and still unexplained phenomenon discovered by the present inventors.

Since Pt is deteriorated by a prolonged exposure to hydrogen at high temperature, it is preferable to undertake either bias-enhanced nucleation of diamond or diamond CVD, or both, using source gases which do not contain hydrogen, for example, carbon monoxide (CO) or a combination of CO and carbon dioxide ($CO_2$). However, at the present stage, usage of the known combinations of gases, such as hydrocarbon, hydrogen, and oxygen as the source gas, is more advantageous than that of CO in view of safety and cost.

In the CVD of diamond on Pt or its alloys, the catalytic action of Pt gives a strong influence on the CVD of diamond, unlike silicon, which is most often used as substrates for CVD. In order to identify the optimum growth conditions for diamond growth, the present inventors repeated a number of experiments, and found that (111) crystal facets of diamond are dominant at diamond film surfaces when CVD is undertaken under the following CVD conditions on Pt or Pt alloy substrates with (111) crystal surfaces: for the source gas, a mixture of methane ($CH_4$) diluted by hydrogen and oxygen ($O_2$) is used, where the $CH_4$ and $O_2$ concentrations in the source gas, denoted as $[CH_4]$ and $[O_2]$, respectively, are $0.1\% \leq [CH_4] \leq 5\%$ and $0.1\% < [O_2] \leq 3\%$, respectively, and the substrate temperature is above 750° C.

Platinum and its alloys are expensive, but their usage as the substrates for CVD will not lead to increased cost in the production of monocrystalline diamond films, because they are easily detached from diamond films after CVD. Using metal substrates is rather advantageous, because they can be used as electrodes for diamond film applications for electronic sensors and devices.

In case that the deposited monocrystalline diamond films are used for optical windows and heat sinks, no substrates are needed. In such cases, the substrate materials can be mechanically or chemically removed. Furthermore, polishing of one or both sides of the free-standing diamond films is possible for those applications.

The thickness of monocrystalline diamond films depends only on the duration time of CVD. Generally, it can be between 0.1 microns to 1 mm. It is also possible to form monocrystalline diamond films on substrates by microwave plasma CVD, which is then followed by plasma jet or combustion CVD to make the film significantly thicker.

Semiconducting monocrystalline diamond films of p- and n-type can be deposited by introducing boron (B)-containing gas (such as $B_2H_6$) and phosphorus-containing gas (such as $PH_3$), respectively, in the source gas during CVD.

In the present invention, it is easy to grow monocrystalline diamond films in selected areas of the substrate. This is achieved by masking unnecessary areas with silicon nitride or silicon oxide films prior to diamond CVD.

EXAMPLES

Example 1

An as received Pt foil (>99.99%,>0.2 mm thick) was maintained at a temperature above 1000° C. in air for more than 4 hours, and (1) roller press process, (2) surface cleaning process, and (3) annealing process in air at temperature above 800° C. (preferably above 1400° C.) for more than 10 hours were repeated for three times. It was then found that (111) crystal domains of Pt were dominant at the foil surface. The foil thickness then was about 0.1 mm.

The existence of the (111) crystal domains was observed by optical microscopy, as they have a characteristic appearance. The (111) structure was confirmed by Reflection High Energy Electron Diffraction (RHEED) and Electron Channeling Pattern (ECP) using an electron microscope. Further analyses of the domain structure using transmission electron microscopy (TEM) revealed that the domain surfaces were actually tilted within ±10°, although the majority of the domain surfaces were exactly (111).

The substrate was then ultrasonically polished with diamond powder dispersed in ethanol for 10 minutes.

Figure 6:
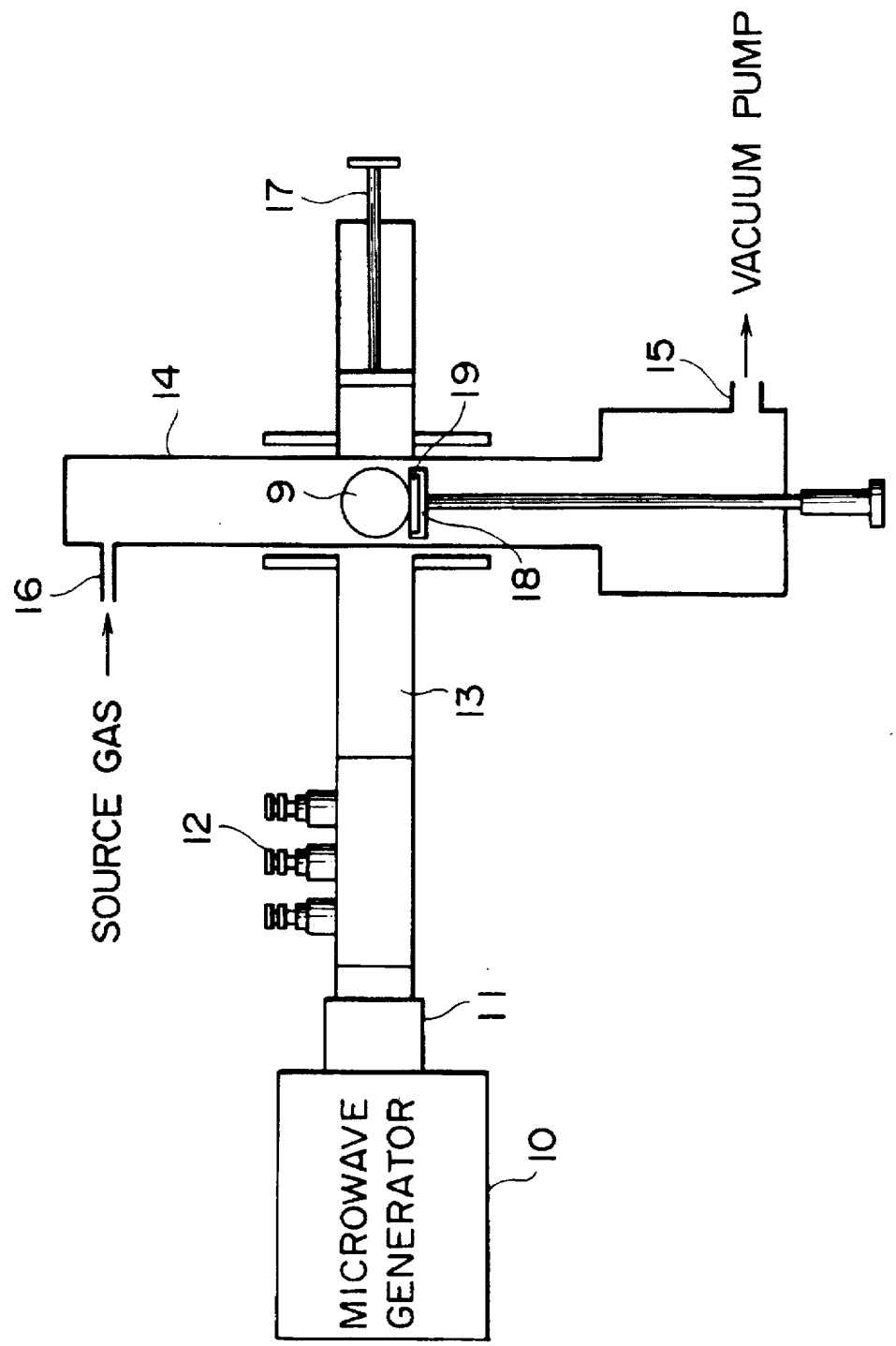
FIG. 6 is a schematic diagram of a standard microwave plasma CVD reactor.

Diamond CVD was carried out using the substrates thus made. FIG. 6 schematically shows a microwave plasma CVD apparatus used. Microwave was generated in the system consisting of a microwave generator 10, an isolator 11, a tuner 12, and guided toward a plunger 17 through a wave guide 13. A quartz tube 14 was penetrating perpendicularly the wave guide 13. There was a gas inlet port 16 at the upper part of the quartz tube 14, and a gas outlet port 15, leading to a vacuum pump, at the lower part of the quartz tube 14. A substrate holder 18 was placed at the center of the intersection between the quartz tube 14 and the wave guide 13 inside the quartz tube 14. A substrate 19 for diamond deposition was placed on the substrate holder 18. Note that the position of the substrate holder 18 was set by a positioning mechanism (not shown).

The Pt substrate prepared above was placed on the substrate holder 18, and the reaction chamber, i.e. the quartz tube, was evacuated from the gas outlet 15 by a rotary pump. Subsequently, a methane/hydrogen mixed gas with a methane concentration of 0.2–0.8% was introduced at a rate of 100 standard cubic centimeters per minute (sccm), maintaining the chamber pressure at 30–60 Torr (1 Torr=133 Pa). The microwave from the microwave generator 10 was led to the quartz tube 14 through the wave guide 13 in order to produce a plasma in the chamber 14. The substrate temperature was kept at 800°–890° C. by adjusting the microwave power and the substrate position. The substrate temperature was monitored from a viewing port at the top of the quartz tube 14. After 4 hours, diamond particles with a (111) orientation, epitaxial to the substrate orientation, were grown on the substrate.

Figure 7:
FIG. 7 is a SEM photograph of a monocrystalline diamond film grown according to the present invention, where (111) facets of diamond are being coalesced. This photograph is taken from the direction normal to the film surface.
Figure 8:
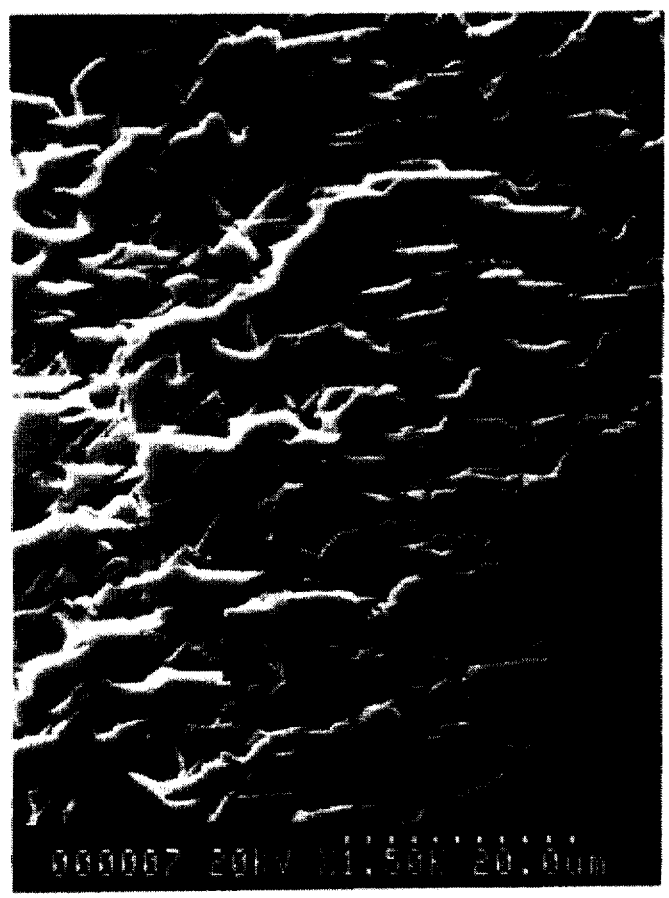
FIG. 8 is a SEM photograph of the same monocrystalline diamond film as that shown in FIG. 7. This photograph is taken from the direction inclined from the surface normal.

After 20 hours, adjacent diamond particles coalesced with each other, and a continuous, monocrystalline diamond film was formed on the substrate. FIGS. 7 and 8 are photographs by scanning electron microscopy (SEM) taken from different angles. It is clearly seen that (111) facets are being coalesced with each other to be a continuous, monocrystalline diamond film.

In the Pt substrate preparation, it was difficult to obtain (111) domains when the foil thickness was greater than 0.5 mm even though the processes (1)–(3) were repeated for several times. However, (111) domains were easily obtained by the processes when the foil thickness was 0.2 mm or less. Therefore, it was concluded that the film thickness must be less than 0.5 mm, preferably 0.2 mm or less, to obtain (111) domains by the processes (1)–(3).

Example 2

Experiments similar to Example 1 were carried out by changing the annealing temperature every 100° C. between 100° and 1500° C. As a result, it was found that (111) domains developed at the surface of the Pt foil, when the foil was annealed at a temperature higher than 800° C. The CVD of diamond on the substrates resulted in monocrystalline diamond films in considerably large regions. It was thus concluded that annealing of Pt foil must be done at a temperature above 800° C. to obtain large (111) domains of Pt.

Annealing experiments were further carried out under five different atmospheres: (a) inert gas, (b) hydrogen, (c) oxygen+hydrogen, (d) inert gas +oxygen, (e) inert gas+ hydrogen. The annealing temperature was 1000° C., and the treatment time was 20 hours. Consequently, (111) domains developed for the case of (a), (c), and (d), while the Pt surface was significantly modified by etching for the case of (b) and (e), and no diamond was grown on those substrates. Therefore, it was concluded that either inert gas or oxidation gas atmospheres are relevant for Pt substrate annealing, while a reduction atmosphere is harmful.

Example 3

The effects of substrate pretreatments on diamond film formation were studied in the same experiments as Example 1. However, the ultrasonic polishing was skipped in this case. It was found that about one to two more hours were needed to form a continuous diamond film than in Example 1. It was thus confirmed that ultrasonic polishing of the Pt substrate increases the nucleation density of diamond.

Example 4

An alloy of 90 atomic % Pt and 10 atomic % Au was initially maintained at a temperature above 1000° C. over 24 hours. Subsequently, the alloy was processed repeatedly by (1) roller press, (2) surface cleaning, and (3) annealing at a temperature above 800° C. (preferably higher than 1400° C.) over 10 hours. As a result, almost the entire surface of the alloy foil consisted of (111) domains, as was observed by optical microscopy. This foil was used as a substrate for diamond CVD, and consequently it was found that diamond particles epitaxially oriented along (111) direction with respect to the underneath (111) domains of the Pt-Au alloy, were grown on the substrate.

Example 5

Experiments similar to Example 4 were carried out using various kinds of Pt alloys as substrates in which more than 50% was Pt. Such alloys included Pt-Ag, Pt-Cu, Pt-Fe, Pt-Ni, Pt-W, Pt-Mo, Pt-Cr, Pt-Mn, Pt-Pd, Pt-Ir, and Pt-Co. After keeping them at a temperature higher than 1000° C. over 24 hours, the processes (1)–(3) were repeated. Similar to Example 4, the surfaces of the alloys consisted of (111) domains, and as a result of diamond CVD, diamond particles, epitaxially oriented along (111) direction with respect to the underneath (111) domains of the alloys, were grown. However, it was not possible to make (111) domains of Pt alloys when the Pt composition was less than 50%.

What is claimed is:

1. A method of manufacturing substrates for growing monocrystalline diamond films by chemical vapor deposition (CVD), in which:

the substrate material is Pt or Pt alloys that have been pre-treated by a single or multiple cycle of processes comprising of roller press and annealing, so that the thicknesses of the Pt and Pt alloys are thinned down to 0.5 mm or less, and hence the entire surfaces or at least part of the surfaces of Pt or Pt alloy substrates are composed of (111) crystal surfaces and/or inclined crystal surfaces with angular deviations within ±10 degrees from (111).

2. A method of manufacturing substrates for growing monocrystalline diamond films by CVD according to claim 1, wherein the minority components of the Pt alloys comprise of single or plural elements selected from the group of the VIA elements such as Cr, Mo, and W, the VIIA elements such as Fe, Co, Ir, Ni, and Pd, and the IB elements such as Au, Ag, and Cu, and the total concentration of the minority components is less than 50 atomic %.

3. A method of manufacturing substrates for growing monocrystalline diamond films by CVD according to claim 1, wherein the annealing of the said Pt or Pt alloys is done at temperatures above 800° C.

4. A method of manufacturing substrates for growing monocrystalline diamond films by CVD according to claim 1, wherein the said cycle includes a process of cleaning Pt or Pt alloys prior to the roller press process, and thus the single cycle comprises of cleaning, roller press, and annealing.

5. A method of manufacturing substrates for growing monocrystalline diamond films by CVD according to claims 1, wherein the annealing process is undertaken in an oxidation atmosphere.

6. A method of manufacturing substrates for growing monocrystalline diamond films by CVD according to claim 1, wherein the surfaces of said Pt or Pt alloys are buff or ultrasonically polished with diamond powder or paste.

* * * * *